US006820046B1

(12) United States Patent
Lamson et al.

(10) Patent No.: US 6,820,046 B1
(45) Date of Patent: Nov. 16, 2004

(54) SYSTEM FOR ELECTRICALLY MODELING AN ELECTRONIC STRUCTURE AND METHOD OF OPERATION

(75) Inventors: Michael A. Lamson, Anna, TX (US); Subhendu Kundu, Karnataka (IN); Ramani Ramesh, Karnataka (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/482,332

(22) Filed: Jan. 14, 2000

Related U.S. Application Data (60) Provisional application No. 60/116,274, filed on Jan. 19, 1999.

(51) Int. Cl.[7] .............................................. G06F 17/50
(52) U.S. Cl. ............................. 703/14; 703/2; 703/13; 716/7; 716/8; 716/16; 257/209; 364/578
(58) Field of Search ............................. 703/2, 13, 14; 257/209; 716/16, 7, 8; 364/578

(56) References Cited

U.S. PATENT DOCUMENTS

| | | | | |
|---|---|---|---|---|
| 5,297,053 A | * | 3/1994 | Pease et al. ................. 700/182 |
| 5,371,390 A | * | 12/1994 | Mohsen ....................... 257/209 |
| 5,455,775 A | * | 10/1995 | Huber et al. .................... 716/7 |
| 5,504,354 A | * | 4/1996 | Mohsen ....................... 257/209 |
| 5,504,370 A | * | 4/1996 | Lin et al. ..................... 257/676 |
| 5,629,861 A | * | 5/1997 | Kim .............................. 716/8 |
| 5,694,344 A | * | 12/1997 | Yip et al. ....................... 703/2 |
| 5,834,840 A | * | 11/1998 | Robbins et al. ............. 257/705 |
| 5,923,563 A | * | 7/1999 | Lavin et al. .................. 716/19 |
| 6,022,649 A | * | 2/2000 | Neoh et al. .................... 430/22 |
| 6,041,269 A | * | 3/2000 | Tain ............................ 700/121 |
| 6,289,116 B1 | * | 9/2001 | Chamberlain et al. ....... 382/141 |
| 2001/0039646 A1 | * | 11/2001 | Mohsen ......................... 716/16 |

FOREIGN PATENT DOCUMENTS

WO            WO 95/15007        *   6/1995     ........... H01L/23/02

OTHER PUBLICATIONS

"New Electrical Modeling Approach for Simultaneous Switching Noise for High–Performance Packages", K. Kato, 1996 Electronic Components and Technology Conference, pp. 739–746, IEEE 1996.*

"Time–Domain Characterization of Packaging Effects via Segmentation Technique", M. Righi, IEEE Transactions on Microwave Theory and Techniques, vol. 45, No. 10, Oct. 1997.*

(List continued on next page.)

*Primary Examiner*—Jean R. Homere
*Assistant Examiner*—Fred Ferris
(74) *Attorney, Agent, or Firm*—W. James Brady, III; Frederick J. Telecky, Jr.

(57) ABSTRACT

According to the electrical modeling system and method provided by the present invention, the electronic structure to be modeled is segmented into an ordered sequence of segments, each segment is electrically analyzed individually, and the resulting data is collated, or integrated back again whereby the model output is preferably created in a format generally suitable for electrical models of integrated circuits. Examples of electronic structures which can be modeled by the system and method of the invention include leadframes, packages, complete devices, and electronic devices assembled on motherboards.

28 Claims, 5 Drawing Sheets

OTHER PUBLICATIONS

"New Electrical Modelling Approach for Simultaneous Switching Noise for High–Performance Packages", K. Kato, 1996 Electronic Components and Technology Conference, pp. 739–746, IEEE 1996.*

"Time–Domain Characterization of Packaging Effects via Segmentation Technique", M. Righi, IEEE Transactions on Microwave Theory and Techniques, vol. 45, No. 10, Oct. 1997.*

"Fasthenry: A Multipole–Accelerated 3–D Inductance Extraction Program", M Kamon et al, IEEE Transactions on Microwave Techniques, vol. 42, No. 9 Sep. 1994.*

"Electrical Performance of High–Speed Interconnect Systems", M.R. Scheinfein et al, IEEE Transactions of components, Hybrids, and Manufacturing Technology, vol. CHMT–10, No. 3, Sep. 1987.*

"Multiconductor Transmission Lines in Multilayered Dielectric Media", C. Wei et al, IEEE Transactions on Microwave Techniques, vol. 32, No. 4 Apr. 1984.*

* cited by examiner

SYSTEM FOR ELECTRICALLY MODELING AN ELECTRONIC STRUCTURE AND METHOD OF OPERATION

This application claims the benefit of Provisional application Ser. No. 60/116,274, filed Jan. 19, 1999.

FIELD OF THE INVENTION

The present invention is related in general to the field of electronic systems and semiconductor devices and more specifically to improved systems and methods for electrically modeling an electronic structure such as an integrated circuit package and assembly.

DESCRIPTION OF THE RELATED ART

Designers of semiconductor integrated circuits (ICs) have used modeling of electrical characteristics for a long time in order to arrive at optimized layouts for the ICs. One of the best known IC modeling systems is called SPICE ("Simulation Programs for Integrated Circuits in Electronics"). For the package, however, which encapsulates the IC no such modeling system exists. Packages are not fine-tuned to leave the IC characteristics undiminished; for example, loss of speed, frequency limitations, cross talk, noise are often observed.

These limitations have become intolerable for the increasing performance demands on ICs. The trends of leadership chips, to be matched by their prospective packages, call for 100 picoseconds edge rates, equivalent to more than 2.6 gigabit/second clocks; lead counts in excess of 1000; collapsing power rails at 1.8 volts, calling for lower noise budget; higher power dissipation, requiring higher capabilities for changing current in time; packages less than 1 millimeter thick; tighter package lead pitch; and last but not least, lower cost.

It is that market trend listed last which is now becoming all-pervasive. As a consequence, the cycle time needed to design a new package is soon required to shrink to approximately 2 weeks; furthermore, it is becoming more and more mandatory to use mostly low cost materials and existing installed manufacturing machines. In addition, reliability expectations for the semiconductor device are increasing in order to lower the cost of ownership; designing-in and building-in reliability through optimized design and process control are the methods proposed to reach the improved product reliability.

In order to meet these often conflicting requirements and to support these ambitious trends, the electrical design of packages for IC devices must more and more be based on sensitive modeling and analysis. Guided by the Semiconductor Research Corporation (SRC), universities such as the University of Arizona at Tucson or the University of California at Berkeley, have been creating and developing electrical simulation and analysis programs for semiconductor packages for several years. While these calculation programs are accurate, their application turned out to be cumbersome in the practical world of industry designers, and sometimes unnecessarily detailed. Unfortunately, there is no system available in known technology which combines a straightforward application of the electrical programs developed at universities with user-friendly features of simplicity, flexibility, and time saving as required by the competitive reality of the semiconductor industry.

An urgent need has therefore arisen for a low-cost, fast and reliable system and a method of operation providing electrical modeling and analysis of electronic structures. The system should provide the opportunity to model the electrical performance of complete semiconductor packages as well as individual parts of it, packages alone as well as in combination with the integrated circuit chip, and semiconductor devices assembled on boards. The system and method should be flexible enough to be applied for different semiconductor product families and a wide spectrum of design, material and process variations, and should spearhead the way for very high frequency, high power packages, as well as toward the goals of improved product yield and device reliability. Preferably, these innovations should be accomplished using conventional workstation and personal computers so that no investment in powerful computing equipment is needed.

SUMMARY OF THE INVENTION

According to the electrical modeling system and method provided by the present invention, the electronic structure to be modeled is segmented into an ordered sequence of sections, each section is electrically analyzed individually, and the resulting data is collated, or integrated back again to create the electrical model of the complete structure, whereby the model output is preferably created in a format generally suitable for electrical models of integrated circuits. Examples of electronic structures which can be modeled by the system and method of the invention include leadframes, packages, complete devices, and electronic devices assembled on motherboards.

The present invention is related to high density ICs, especially those to be used at very high frequencies and having high numbers of input/outputs and tight constraints in package outline and profile. These ICs can be found in many semiconductor device families such as processors, standard linear and logic products, digital and analog devices, high frequency and high power devices, and both large and small area chip categories. Since the invention aims at designing devices with minimum geometries and high reliability, it supports continually shrinking applications such as cellular communications, pagers, hard disk drives, laptop computers and medical instrumentation.

It is an object of the present invention to provide an automated system and method for electrically modeling an electronic structure. The object is achieved by an embodiment of the invention using a computer system and a computer-implemented method for automatically analyzing and modeling the electronic structure.

Another object of the present invention is to provide a highly flexible system and method. This object is achieved by the embodiments of four subsystems of the invention:

A user-friendly interface operable to accept user instructions and to control the system operations at a plurality of software control points.

An input data generator operable to accept graphical and geometric inputs, to create patterns of electrical conductors and insulators, and to accept compositional and functional parameters.

A model data analyzer operable to perform two-dimensional and three-dimensional analyses and mixtures thereof.

A model output generator operable to create the model in a plurality of formats, especially those suitable to interface with electrical IC models.

Another object of the present invention is to provide an electrical model of an electronic structure in fast turn-around time and with minimum effort by taking full advantage of symmetries and branching of the structure. This object has been achieved by the embodiments of three-subsystems of the invention:

A segmentation generator operable to select segments of the structure to be modeled and to organize the sequence of these segments.

An analysis generator operable to electrically analyze those segments in a plurality of calculation programs, executed in sequence.

An integrator operable to collate and integrate the analysis results in controlled sequence into a single model.

Another object of the present invention is to introduce modeling concepts which are flexible so that they can be applied to many families of electronic structures—reaching from piece parts, such as leadframes, to device packages, to complete semiconductor IC products, to electronic substrates, and to whole assemblies on motherboards—and are general so that they can be applied to several generations of products.

These objects have been achieved by teachings and embodiments of the invention. Various modifications have been successfully employed to satisfy different selections of product geometries, compositions and characteristics. The method of the invention provides easy expansion to new fields of IC modeling, such as inclusion of three-dimensional contributions, or transmission and shielding effects in ultra-high frequency products. Further, the method of the invention provides easy specialization to customer-specific requirements, such as ranking of the options for minimizing certain product parameters.

The technical advances represented by the invention, as well as the objects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

One major problem associated with electrical analysis and modeling of an electronic structure, such as an integrated circuit (IC) package, is the time it takes to complete the analysis after all the elements have been generated. This is true even for piece parts of an IC package, such as a metallic leadframe. One way of avoiding some of this processing time is to exploit features of symmetry and branching found in the electronic structure in order to cut down the number of elements that must be processed. However, due to the complex geometries and compositions found in most electronic structures, such as contemporary packages, the definition of the most effective segmentation of the structure emerges as a pivotal ingredient of successful electrical modeling.

A second problem with electrical analysis and modeling of an electronic structure is the flexibility to put the model parts automatically together again such that they provide not only the model of the complete structure, but also quantify alternative choices to the user. With this capability, existing limitations and potential variations of the electronic structure can be highlighted—major ingredients of reliability insurance and innovative solutions.

A third problem is the wide variety of inputs generally presented to the model generator. An automatic standardization and input format definition simplifies the job of effective analysis in short turn-around time.

Figure 1:
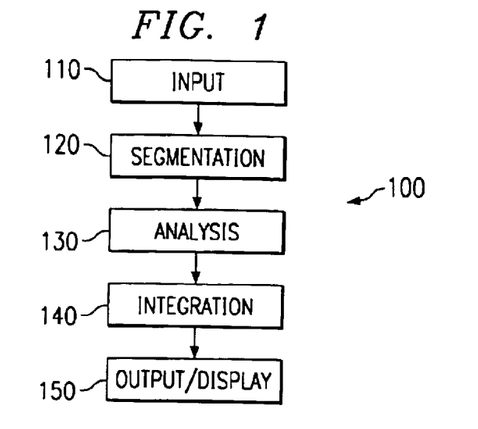
FIG. 1 illustrates a block diagram of a system for electrically modeling an electronic structure according to the invention.

As illustrated schematically in the simplified block diagram of FIG. 1, the system of the present invention, generally designated 100, operates to automatically provide segmentation as well as integration for creating an electrical model of an electronic structure. An input data generator 110 generates input data which describe a variety of characteristics of the structure to be modeled. Included in these characteristics are geometries, graphics and data related to any segments, subdivisions, materials, and other parameters. Input data generator 110 is connected to a segmentation generator 120 which selects the segments of the structure to be analyzed. It further organizes the correct sequence of these segments, and then stores the data related to the segments, arranged in sequence, in a segment file. Afterwards, the data of this segment file is converted into a format suitable for electrical analysis.

The segmentation generator 120 is connected to the analysis generator 130 which electrically analyzes the converted data of the segment file in a multitude of calculation programs. These programs are automatically executed in sequence, and the results of the electrical analysis are stored in an analysis output file.

Coupled to the analysis generator 130 is an integrator 140 which integrates the analysis output into a single model. This integration is performed in an automatically controlled sequence, and the model is filed in a report storage. From this storage, an output generator 150, coupled to the integrator 140, creates the summary files in a plurality of predetermined formats, or displays the model results on a display monitor.

Modeling system 100 can be used to model and analyze electronic structures such as a metallic leadframe, as used in electronic devices; a complete IC package; an IC package with an IC chip assembled inside; a substrate with conductive patterns embedded in an insulating medium, as used for electronic devices; any pattern comprising electrical resistances, capacitances, and inductances; or a semiconductor device assembled on an electronic substrate. An embodiment of the present invention may be embedded in an IC; another preferred embodiment is a computer system.

For an embodiment in a computer system, examples of the requirements are as follows:

Hardware:
    Platform/Model SUN SPARC station, such as 4/60, 4/65, 4/75 HP 9000 Series 700, such as 710, 720
    Memory 32 Mbytes
    Disk 100 Mbytes minimum
    Peripherals None Software:
   Operating System SOLARIS 2.5 and above HP 9000
      Series 700, such as HP-UX 9.X Any X Windows™
      Manager
   Other Software Pro/ENGINEER™ X11R5
   Technology Independent
   Input IGES ("Initial Graphics Exchange
      Specification")
      DXF ("Drawing Exchange Format")
   Output SPICE ("Simulation Program with Integrated
      Circuit Emphasis") for use with IC designs
      IBIS ("I/O Buffer Interface Specification") for use
         with system designs
      Summary file (electrical parameters for each
         frequency)
      Report file (lumped values of electrical parameters
         for all leads, variation of parameters with frequency
      S-Parameter files ("scattering parameters")
   Other Interfaces AutoCAD™ ("Automatic Computer
      Aided Design")
      SPICE
      EESOF Pro/ENGINEER™ is produced by Parametric Technology Corporation, Waltham, Mass., USA. AutoCAD™ is produced by Autocheck Incorporated, Cupertino, Calif., USA.

Figure 2:
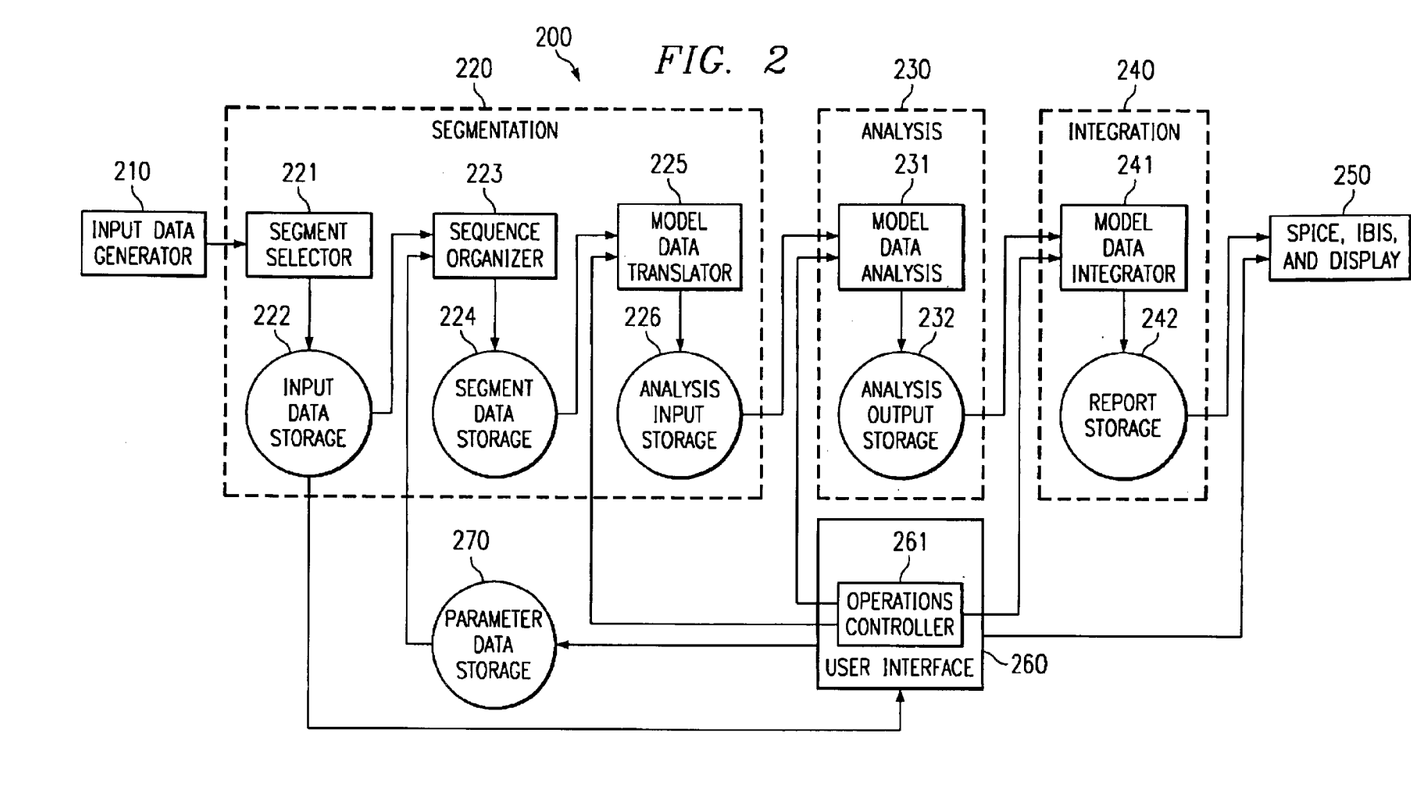
FIG. 2 illustrates a block diagram of a computer system for electrically modeling an electronic structure including a first embodiment of the present invention.

An embodiment of the computer system of the present invention is illustrated in the schematic block diagram of FIG. 2 and generally designated 200. The major parts of the computer system are, analogous to FIG. 1, the input data generator 210, the segmentation generator 220, the analysis generator 230, the integrator 240, and the output generator 250.

The input data generator 210 accepts and stores graphical, geometric, functional and compositional inputs; it further is able to create patterns of electrical conductors and insulators of a structure to be modeled. Data input generator 210 is described in more detail in conjunction with FIG. 3.

Coupled to input data generator 210 in FIG. 2 is a segment selector 221. It selects the segments and test lines of the structure to be modeled; it further selects the input data correlated to the segments and test lines from the input data generator. This data is then stored in the input data storage 222 (described in more detail in FIG. 3).

The segment selector 221 exploits any symmetry and branching exhibited by the structure to be modeled. By way of example, structures such as leadframes or packages may be symmetrical to only one axis; in this case, one needs to model only half of the leadframe or package; the results for the other half are reflected as required to get the complete model. Analogous considerations hold for two or more symmetry axes.

Input data storage 222 of FIG. 2 is connected to sequence organizer 223, which arranges the selected segments in the correct order for modeling. The sequence organizer 223 further creates the segment data files stored in the segment data storage 224. Input data storage 222 is further connected to a user interface 260. This user interface 260 responds to user commands for controlling the execution and timing of a multitude of operations of the computer system. A major part of the user system is the operations controller 261 which provides automated control functions at a plurality of points in the modeling process flow (described in more detail in conjunction with FIG. 6).

Sequence organizer 223 in FIG. 2 is further connected to the parameter data storage 270. This data storage contains parametric data on all analysis types, standard values for materials properties, and can specify global parameters applicable to the electronic structure to be modeled. Parameter storage 270 can be supplied with data from the user interface 260, with which it is coupled.

A key embodiment of the present invention is model data translator 225. It is coupled to segment data storage 224 and reads the segment data files stored there. Translator 225 is also coupled to the operations controller 261 embedded in the user interface 260; it can thus follow instructions from controller 261. Model data translator 225 converts the segment data into a format suitable for electrical analysis by any computational program used in the model data analysis. The results of this conversion are stored in the analysis input storage 226.

The analysis generator 230 in FIG. 2 is the actual analysis engine of the modeling system. It contains the model data analysis 231 which is coupled to the analysis input storage 226 and further to the operations controller 261 embedded in the user interface 260. The model data analysis 231 executes a plurality of electrical calculation programs in sequence, and creates the electrical analysis output files which are stored in the analysis output storage 232.

In the preferred embodiment of the invention, the electrical calculation programs used by the model data analysis 231 are typically invoked multiple times during an analysis run to cover all test lines and specified frequencies. Most of these programs have been developed by the University of Arizona at Tucson; they include two-dimensional electrical analysis programs and three-dimensional electrical analysis programs for capacitance as well as inductance calculations (including bends, steps, and vias). The analysis output files 232 contain capacitance, inductance and resistance per centimeter of conductor length in matrix format.

The format of the output may be such that in the capacitance matrices, the diagonal entries describe the self-capacitance of the conductor, while the off-diagonal entries describe, the coupling capacitance between two conductors. In the inductance matrices, the diagonal entries describe the self-inductance of the conductor, while the off-diagonal entries describe the mutual inductance between two conductors. In the resistance matrices, the diagonal entries describe the resistance of the conductor. When modeling with symmetry, the cross coupling effect of conductors beyond any symmetry axis is calculated by adding extra conductors as needed whenever possible.

The integrator 240 in FIG. 2 includes the model data integrator 241 which is coupled to the analysis output storage 232 and further to the operations controller 261. The model data integrator 241 integrates the analysis output files in 232 in controlled sequence into a single model file stores this model file in the report storage 242.

This report storage 242 is connected to the output generator 250, which is further coupled to the user interface 260. The output generator 250 creates the electrical model for each frequency analysis in the desired format. Examples of preferred output formats include SPICE-acceptable decks, IBIS decks, S-Parameter files, summary reports, and generally displays on monitors.

Figure 3:
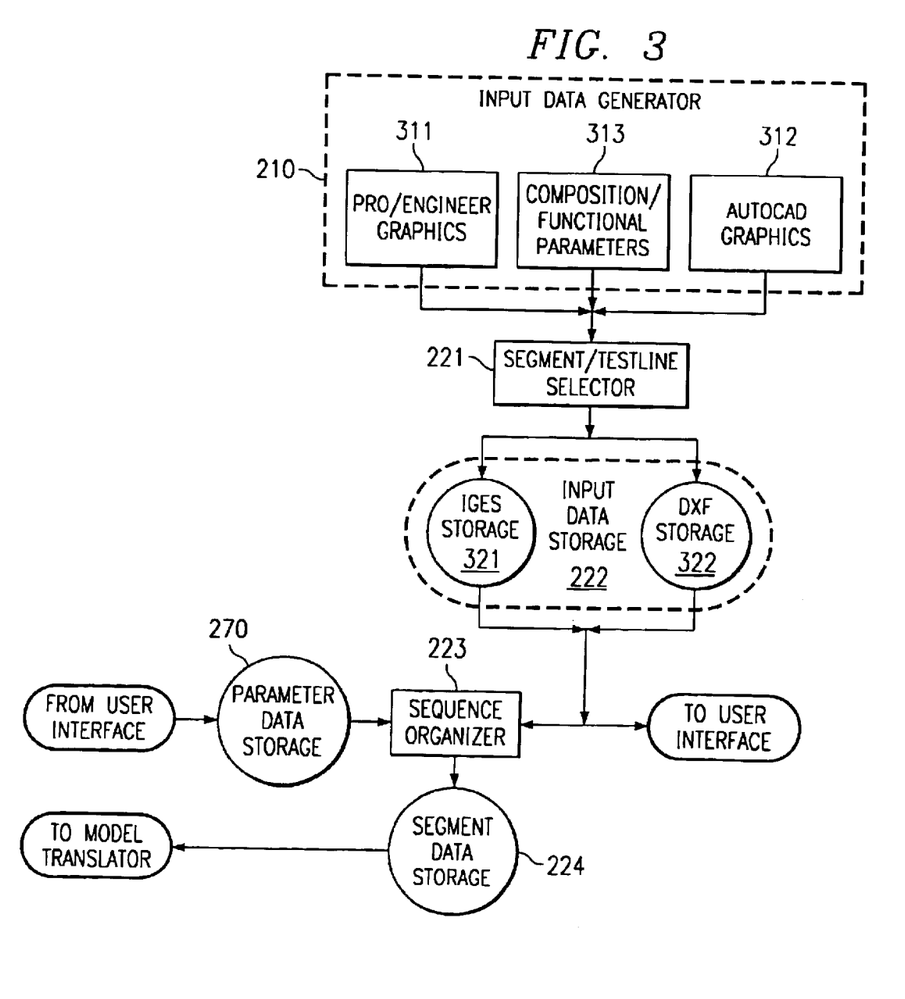
FIG. 3 illustrates a block diagram of the detail of the input data generator and the input data storage according to the invention.

FIG. 3 illustrates, in a schematic block diagram, the input data generator of the computerized modeling system in a preferred embodiment of the present invention. The input data generator 210 comprises a number of graphics inputs; shown are inputs from Pro/ENGINEER™ 311 and AutoCAD™ 312. The geometric or graphical program for Pro/ENGINEER has to be in the IGES format, the geometric and graphical program for AutoCAD™ in the DXF format.

In either case, the system provides to accept, select, read and edit an existing drawing of the structure to be modeled, or to draw a structure from scratch. Usually, the structure will consist of patterns made of electrical conductors or insulators, or both.

In order to supply the compositional and functional parameters needed for quantitatively characterizing the input graphics, the input data generator 210 provides the parametric input unit 313. It is also coupled to segment selector 221.

The segment selector 221 serves the pivotal function of defining subdivisions of the structure suitable for electrical analysis. A suitable subdivision, or section, consists of a set of continuous conductors. Any discontinuity, such as a bend, marks the end of a subdivision. The system user can indicate a subdivision by drawing so-called "testlines" across the set of conductors in that subdivision. A testline should be at the center of the conductors and perpendicular to them. One can draw several testlines to cover all the subdivisions of the structure to be modeled. When a testline crosses a conductor, it has to cross both edges of the conductor.

In order to simplify the job of the sequence organizer 223 to establish the correct segment order for analysis, rules or conventions for the sequence of the testlines have to be established and followed. As an example, when the structure to be analyzed is a semiconductor package with a leadframe, the rule for ordering the testlines may be such that the conductor subdivisions they identify start from the chip side of the package to the outside.

In FIG. 3, the input data storage 222 is shown with a storage 321 reserved for files in the IGES format, and a storage 322 reserved for files in the DXF format. These are examples and preferred embodiments of the organization of input data storage 222; other examples and formats are possible. The input data storage is connected to both the sequence organizer 223 and the user interface 260 (see FIG. 2).

Figure 4:
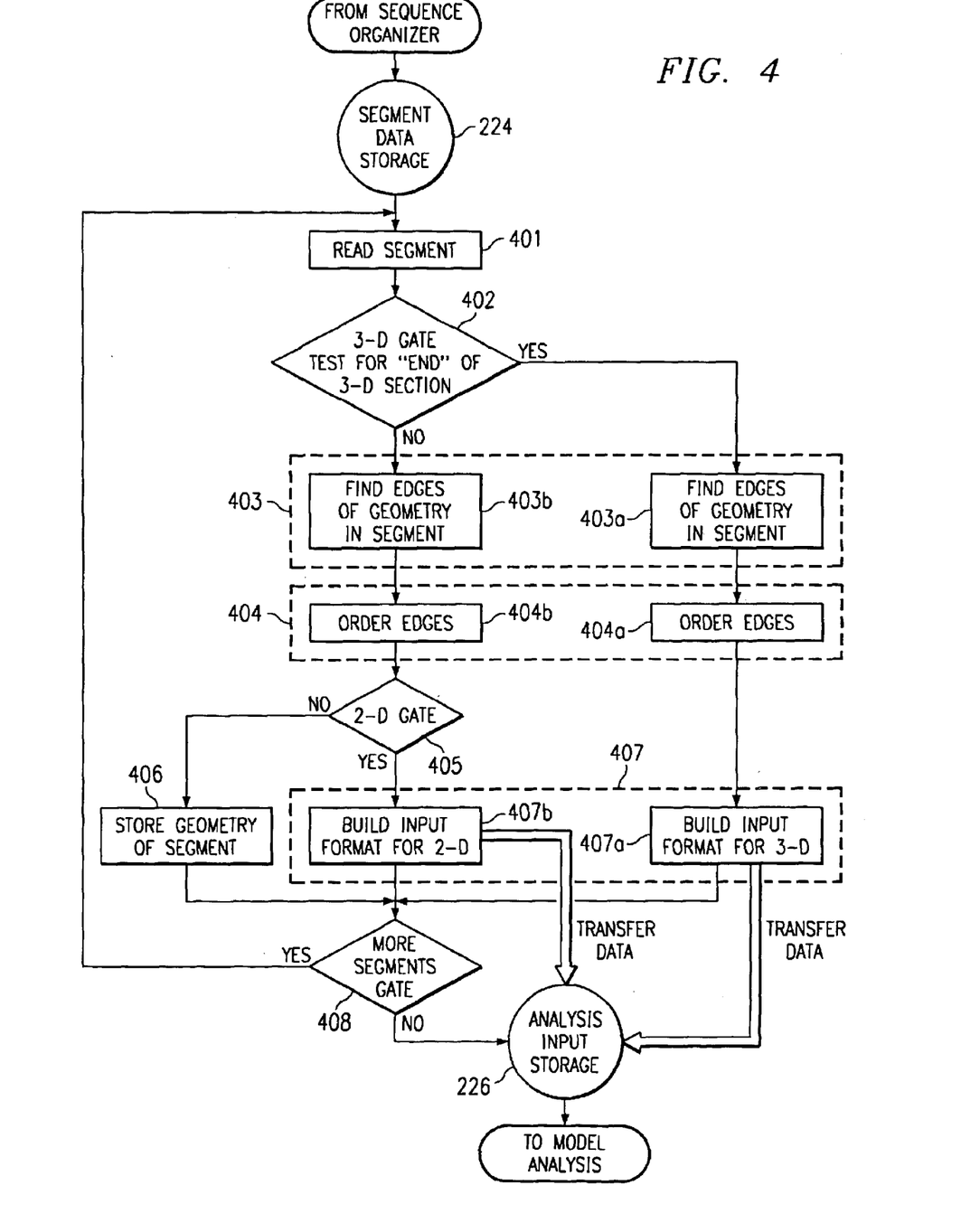
FIG. 4 is a flow chart of the method used to generate inputs in the format suitable for the model analysis, including a second embodiment of the invention.

After creating the segments in segment selector 221, the segments are arranged in the correct order by segment organizer 223; the correct order is controlled by operations controller 261. The segment data, supplemented by parametric data from parameter data files 270, are filed in segment data storage 224. FIG. 4 details the flow diagram for the computer-implemented method how the model data translator 225 reads the segment data storage 224 (in IGES or DXF format) and converts it to the input files required for electrical analysis (and stored in analysis input storage 226).

Referring to FIG. 4, the method of conversion begins in step 401 as the system is reading the first segment filed in the segment data storage. The system then identifies all element groups that form a segment by a series of automatic steps. Assuming first that the segment is of three-dimensional nature, the system determines in step 402 whether the end of the three-dimensional segment has been reached. In step 403, the system generally finds the edges of the geometry in the segment; in step 404, the system orders the edges in the correct sequence.

If the answer to check 402 is "yes", the system finds the edges of the three-dimensional geometry in step 403a, and orders the edges in the correct sequence in step 404a.

In step 407, the system converts the data of the ordered segment edges into the input format for electrical analysis. For the three-dimensional segment, after the ordering of the edges in step 404a, the system builds the input format for the ordered three-dimensional segment in step 407a. The system transfers the data converted into the analysis input format to the analysis input storage 226, which is connected to the model data analysis generator. In addition, the system uses the converted data from step 407a to determine in step 408 whether another segment is stored in segment data storage 224. If the answer is "yes", then the system repeats the process flow starting with reading the next segment in step 401. All process steps are repeated until all segments in segment data storage 224 have been read and converted. If the answer in checkpoint 408 is "no", the system proceeds to analysis input storage 226 coupled to the model data analysis generator.

If the answer to check 402 is "no", the end of the three-dimensional segment has not been reached; the system then finds the edges of that segment geometry in step 403b, and orders the edges in the correct sequence in step 404b.

In step 405, the system determines the segment is of two-dimensional geometry. If the answer is "no", the system stores the geometry of the segment in step 406 and forwards it to checkpoint 408 to determine whether another segment is stored in segment data storage 224. If the answer is "yes", the system builds the input format for the ordered two-dimensional segment in step 407b. The system transfers the data converted to the analysis input format to the analysis input storage 226, which is connected to the model data analysis generator. In addition, the system uses the converted data from step 407b to determine in step 408 whether another segment is stored in segment data storage 224.

Figure 5:
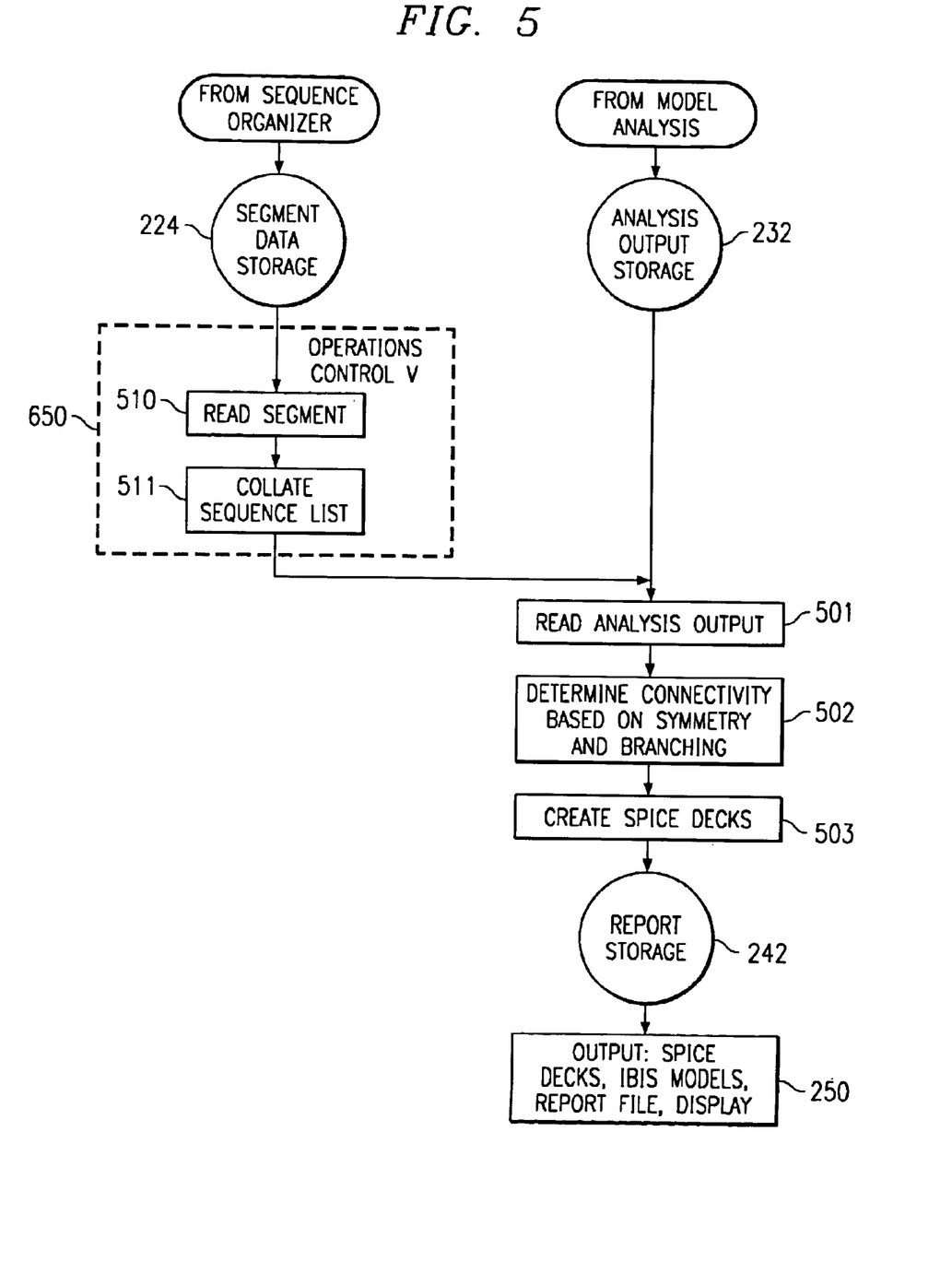
FIG. 5 is a flow chart of the method used in the model data integrator to generate model-outputs, including a third embodiment of the invention.

FIG. 5 details the flow diagram for the computer-implemented method how the model data integrator 241, as part of the integrator 240, reads the analysis output storage 232 and integrates the analysis output files into a single model file. Referring to FIG. 5, the method of integration begins in step 501, as the system is reading the analysis output file recorded in the analysis output storage 232, as supplied by the model data analysis. The system then controls this analysis output by reading each segment (step 510) from the segment data storage 224 (as supplied by the sequence organizer) under the guidance of the operations control V (to be designated 650 in FIG. 6). As described in conjunction with FIG. 2, the overall operations controller 261, including operations control V, is imbedded in the user interface 260 and connected to the segment data storage 224 through the input data storage 222. The combination of reading and controlling enables the collating of the sequence list (step 511) of the analysis output data, an important step of computer system embodiment of the present invention.

With the collated sequence list, the system determines electrical connectivity and branching in step 502. The analysis output data can thus be collated into electrical models of complete electronic structures (such as leadframes, packages, assemblies), from which the system creates the analysis output 503 in suitable format. As an example, FIG. 5 emphasizes SPICE decks, since SPICE format is conventionally used for IC designs. All analysis output and model results are filed in report storage 242.

The system creates the model results for SPICE in both lumped and distributed electrical circuit formats. It creates different SPICE decks for each of the specified frequencies. Besides creating SPICE decks, the system also provides the output 250 with summary files which provide the raw electrical parameter values; these files are created for each frequency of the analysis. Furthermore, output 250 comprises report files which contain information on the lumped values of the electrical parameters (for instance, for all leads of a leadframe) and a table that lists the variation of parameters over frequency.

Figure 6:
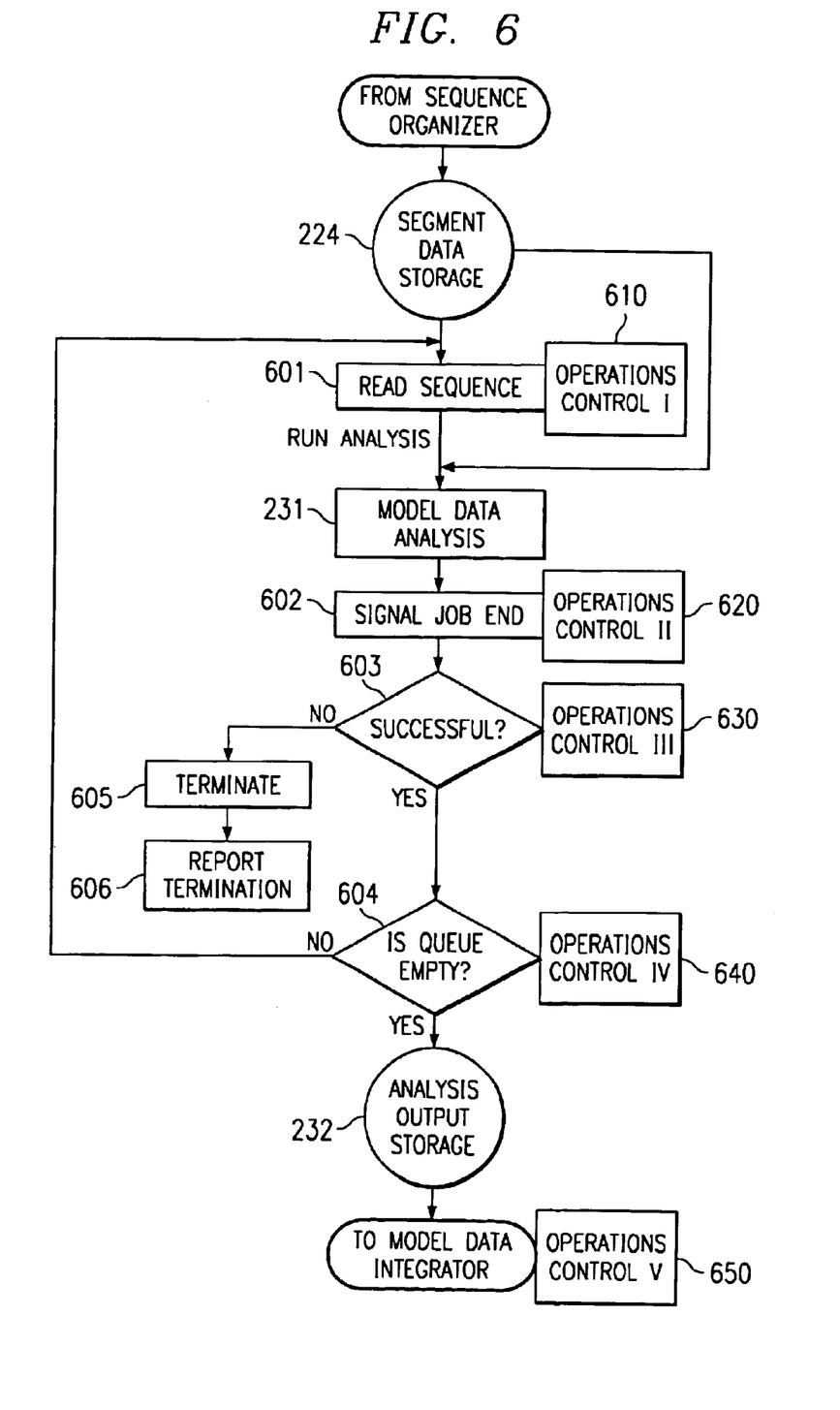
FIG. 6 is a flow chart of the method used by the user interface to control the modeling operations, including a fourth embodiment of the invention.

Output 250 further comprises IBIS models which provide the electrical characteristics of the structure (for instance, of an electronic package) in the I/O Buffer Interface Specification format for use with electronic system design tools. In the S-parameter models, the system provides the scattering parameters of an electronic structure such as a leadframe The computer-implemented method of the invention uses control functions of the user interface 260 (see FIG. 2) in a plurality of steps in the process flow. These process operations are controlled by automatically regulating execution and timing of the operations, as well as by responding to user commands. FIG. 6 summarizes these control functions schematically. The first operations control 610 is provided when segment data, filed in storage 224 and supplied by the sequence organizer, is read in sequence (process step 601). Based on this coordinated sequence, the electrical analysis calculation programs in the model data analysis 231 are run. The system instructs the start of the execution of each of these calculation programs.

In operations control II, designated 620 in FIG. 6, the system is processing signals at the end of each program execution in step 602. In process step 603, controlled by the third operations control 630, the system determines the successful completion of each calculation program. The system refuses failed program executions in process step 605 and reports the termination in step 606. The system accepts successful program executions and forwards them to decision point 604.

The question raised in process step 604 is whether the queue of segments is now empty or still contains one more segment to be forwarded to model data analysis. This search for the next segment is performed under process operations control IV (designated 640 in FIG. 6). If the answer is that there is still one more segment in queue, the sequence of process steps is repeated and operations control I (610) initiates in step 601 the reading of the next segment from segment data storage 224.

On the other hand, if the answer indicates that the queue of segments is empty, the system initiates, in controlled fashion, the storage of the completed analysis results in the analysis output files 232. For this process step, operations control V (designated 650 in FIG. 6 and FIG. 5) instructs the advancement of the model results to the model data integrator.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A system for modeling a package assembly for an integrated circuit device, comprising:
   an input data generator operable to generate input data comprising information describing a plurality of characteristics of a package assembly to be modeled, wherein said plurality of characteristics comprise a plurality of segments, subdivisions, and compositions;
   a segmentation generator, coupled to said input data generator, operable to select the most effective segments of said package, to organize the sequence of said segments, to store the data related to said sequenced segments into a segment file, and to convert said segment file into a format suitable for electrical analysis;
   an analysis generator, coupled to said segmentation generator, operable to electrically analyze said converted segment file in a plurality of calculation programs, executed in sequence, and to create electrical analysis output files;
   an integrator, coupled to said analysis generator, operable to integrate said analysis output files in controlled sequence into a single model file, to quantify alternative choices, and to store said file in a report storage; and
   an output generator, coupled to said integrator, operable to create summary files in specific formats or displays.

2. The system according to claim 1 wherein said segmentation generator comprises:
   a segment selector, coupled to said input data generator, operable to select leadframe segments and test lines of said package to be modeled, select the input data correlated to said segments and test lines, and file said data in an input data storage;
   a sequence organizer, coupled to said input data storage, operable to arrange said segments in the correct order for modeling and to create segment data files; and
   a model data translator, coupled to said segment data file, operable to read said segment data files, to convert said segment into a format suitable for electrical analysis, and to create an analysis input storage, suitable for electrical analysis to be performed by a plurality of calculation programs executed in sequence.

3. The system according to claim 2 further comprising a source of parametric data coupled to said sequence organizer.

4. The system according to claim 1 wherein said analysis generator comprises two-dimensional and three-dimensional electrical calculation means operable to cover all test lines and specified frequencies.

5. The system according to claim 1 wherein said analysis generator produces a multitude of patterns comprising electrical resistances, capacitances, and inductances.

6. The system according to claim 1 further comprising an integrator operable to calculate the scattering parameters for electrical high frequency assembly.

7. A computer system for modeling an electronic structure, comprising:
   an input data generator operable to accept and store graphical, geometric, functional and compositional inputs and to create patterns of electrical conductors and insulators of the structure to be modeled;
   a segment selector, coupled to said input data generator, operable to select segments and test lines of the structure to be modeled, to select the input data correlated to said segments and test lines from said data generator, and to create input data files;
   a user interface including an operations controller, coupled to said input data files, operable to respond to user commands for controlling execution and timing of a multitude of operations of said computer system;
   a sequence organizer, coupled to said input data file and further to additional parametric data storage, operable to arrange said segments in the correct order for modeling and to create segment data files;
   a model data translator, coupled to said segment data file and further to said operations controller, operable to read said segment data files, to follow instructions from said operations controller, to convert said segment data into a format suitable for electrical analysis, and to store the results in an analysis input storage;
   an analysis generator, coupled to said analysis input storage and further to said operations controller, operable to execute a plurality of electrical calculation programs in sequence and to create electrical analysis output files;

a model data integrator, coupled to said analysis output files and further to said operations controller, operable to integrate said analysis output files in controlled sequence into a single model file and to store said file in a report storage; and an output generator, coupled to said model data integrator and further to said user interface, operable to create said model for each frequency analysis.

8. The computer system according to claim 7 wherein said output generator creates said model in the format of SPICE-acceptable decks, summary and report files, IBIS decks, and displays.

9. The computer system according to claim 7 further comprising a coupling of said parameter data storage to said user interface operable to transmit parametric data to said parameter data storage.

10. The computer system according to claim 7 wherein said input data generator comprises:

an input unit operable to create patterns of electrical conductors and insulators;

a graphical input unit operable to accept, select and read geometric and graphical programs; and a parametric input unit operable to accept compositional and functional parameters.

11. The computer system according to claim 10 wherein said geometric and graphical programs are selected from a group consisting of pro/ENGINEER and AutoCAD programs.

12. The computer system according to claim 7 wherein said input data files, coupled to said segment selector, comprise storage of the input data after segment and test line selection in a format suitable for the selected graphical input program.

13. The computer system according to claim 12 wherein said input data storage is in the IGES format for input data using Pro/ENGINEER graphics, and in the DXF format for input data using AutoCAD graphics.

14. The computer system according to claim 7 wherein said operations controller is operable to coordinate the sequence of electrical analysis calculation programs;

to instruct the start of the execution of each said calculation programs;

to process signals at the end of each program execution;

to control the successful completion of each said calculation programs, thereby providing acceptance of successful executions and refusal of failed executions;

to search for the next said segment in said sequence;

to control the storage of the completed analysis results in said analysis output files; and to instruct their advancement to said model data integrator.

15. The computer system according to claim 7 wherein said parametric data storage is operable to specify global parameters applicable to said electronic structure to be modeled.

16. The computer system according to claim 7 wherein said analysis generator comprises electrical computational programs operable for each electrical frequency; for for each test line of said structure to be modeled that needs two-dimensional analysis;

for each group of test lines of said structure to be modeled forming a three-dimensional segment;

for each test line of said structure to be modeled that needs mixed two-dimensional and three-dimensional analysis; and for each test line of said structure to be modeled that traverses regions of different dielectric constants, electrical potentials, geometries, or symmetries.

17. A computer-implemented method for constructing a model of an electronic structure, comprising the steps of:

generating input data comprising information describing a plurality of characteristics of a structure to be modeled, wherein said plurality of characteristics comprise a plurality of segments, subdivision, and compositions;

generating segments of said structure to be modeled, selecting said segments, organizing the sequence of said segments, storing the data related to said sequenced segments into a segment file, and converting said segment file into a format suitable for electrical analysis;

electrically analyzing said converted segment file in a plurality of calculation programs executed in sequence, and creating electrical analysis output files;

integrating said analysis output files in controlled sequence into a single model file and storing said file in a report storage; and creating summary files in specific formats or displays.

18. The computer-implemented method according to claim 17 wherein said step of generating input data of said electronic structure comprises:

creating patterns of electrical conductors and insulators of said electronic structure;

accepting, selecting and reading geometric and graphical programs describing a plurality of characteristics of said electronic structure; and accepting compositional and functional parameters of said electronic structure.

19. The computer-implemented method according to claim 17 wherein said step of generating segments comprises:

selecting segments and test lines of said structure to be modeled, selecting the input data correlated to said segments and test lines, and filing said data in an input data storage;

arranging said segments in the correct order for modeling, and creating a segment data storage; and converting said segment data storage into a format suitable for electrical analysis, and creating an analysis input storage suitable for electrical analysis to be performed by a plurality of programs executed in sequence.

20. The computer-implemented method according to claim 19 wherein said step of converting said segment data storage into a format suitable for electrical analysis comprises:

reading the first segment from said segment data storage;

identifying all element groups that form a segment by a series of automatic steps comprising:

determining whether the end of the three-dimensional segment has been reached;

finding the edges of the geometry in said segment;

ordering said edges; and determining whether the end of the two-dimensional segment has been reached;

converting the three-dimensional segment data and the two-dimensional segment data into the input format for electrical analysis;

transferring the data in said input format to the analysis input storage;

determining whether another segment is stored in said segment data storage; and repeating all said steps until all segments in said segment data storage have been read and converted.

21. The computer-implemented method according to claim 17 wherein said step of integrating said analysis output files into a single model file comprises:

reading the analysis output as stored in said analysis output files;

controlling said analysis output by reading each segment from said segment data storage and collating a sequence list;

determining electrical connectivity as based on symmetry and branching of said collated sequence list;

creating analysis output in a suitable format; and storing said analysis output in a report storage.

22. The computer-implemented method according to claim 21 wherein said collated sequence list, based on symmetry and branching, generates a model of a complete electronic structure.

23. The computer-implemented method according to claim 21 wherein said format of the analysis output is the SPICE-model format.

24. The computer-implemented method according to claim 21 wherein said analysis output has lumped or distributed format.

25. The computer-implemented method according to claim 17 further comprising the steps of:

controlling process operations by responding to user commands; and automatically controlling execution and timing of a plurality of operations.

26. The computer-implemented method according to claim 25 wherein said step of controlling operations comprises the steps of:

coordinating the sequence of the electrical analysis calculation programs;

instructing the start of the execution of each said calculation programs;

processing signals at the end of each program execution;

controlling the successful completion of each said calculation programs, thereby accepting successful executions and refusing failed executions;

searching for the next said segment in said sequence;

controlling the storage of the completed analysis results in the analysis output files; and instructing the advancement of said results to the model data integrator.

27. A system as in claim 1 wherein said segment selector is operable to define a set of continuous conductor subdivisions.

28. A system as in claim 27 wherein said sequence organizer is operable to define said subdivisions starting from the chip side of the package.

* * * * *